United States Patent
Takenouchi

(10) Patent No.: US 10,607,865 B2
(45) Date of Patent: Mar. 31, 2020

(54) PLATE-SHAPED WORKPIECE PROCESSING METHOD

(71) Applicant: DISCO CORPORATION, Tokyo (JP)

(72) Inventor: Kenji Takenouchi, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 15/940,411

(22) Filed: Mar. 29, 2018

(65) Prior Publication Data

US 2018/0286708 A1 Oct. 4, 2018

(30) Foreign Application Priority Data

Apr. 4, 2017 (JP) .................. 2017-074246

(51) Int. Cl.
*H01L 21/67* (2006.01)
*H01L 21/304* (2006.01)
(Continued)

(52) U.S. Cl.
CPC ........ *H01L 21/67092* (2013.01); *B28D 5/022* (2013.01); *H01L 21/3043* (2013.01);
(Continued)

(58) Field of Classification Search
CPC ......... H01L 21/78–786; H01L 21/3034; H01L 21/68714; H01L 2221/68327;
(Continued)

(56) References Cited

U.S. PATENT DOCUMENTS 6,280,298 B1   8/2001   Gonzales
6,310,017 B1  10/2001   Grant et al.
(Continued)

FOREIGN PATENT DOCUMENTS

JP   06349926 A   12/1994
JP   09055573 A    2/1997
JP   2005021940 A  1/2005

OTHER PUBLICATIONS

Takenouchi, Kenji, U.S. Appl. No. 15/934,491, filed Mar. 23, 2018.
(Continued)

*Primary Examiner* — Laura M Menz
*Assistant Examiner* — Candice Chan
(74) *Attorney, Agent, or Firm* — Greer Burns & Crain, Ltd.

(57) ABSTRACT

A method for processing a plate-shaped workpiece having a division line and a metal member formed on the division line or in an area corresponding to the division line includes a holding step of holding the plate-shaped workpiece on a chuck table where the metal member is exposed, a first cutting step of cutting the plate-shaped workpiece along the division line by using a first cutting blade after performing the holding step, thereby forming a first cut groove dividing the metal member, and a second cutting step of cutting the plate-shaped workpiece along the first cut groove by using a second cutting blade after performing the first cutting step, thereby forming a second cut groove fully cutting the plate-shaped workpiece. The first cutting step includes the step of supplying a cutting fluid containing an organic acid and an oxidizing agent to the plate-shaped workpiece.

18 Claims, 8 Drawing Sheets

(51) Int. Cl.
*H01L 21/78* (2006.01)
*H01L 21/687* (2006.01)
*B28D 5/02* (2006.01)
*H01L 23/31* (2006.01)

(52) U.S. Cl.
CPC ........ *H01L 21/68714* (2013.01); *H01L 21/78* (2013.01); *H01L 23/3114* (2013.01)

(58) Field of Classification Search
CPC ........... H01L 21/67092; H01L 21/3043; H01L 23/3114; H01L 21/304; B28D 5/022–029
See application file for complete search history.

(56) References Cited

U.S. PATENT DOCUMENTS

| | | | |
|---|---|---|---|
| 6,461,940 B1 | 10/2002 | Hasegawa et al. | |
| 6,791,197 B1* | 9/2004 | Katz | B28D 5/022 |
| | | | 257/48 |
| 9,130,057 B1 | 9/2015 | Kumar et al. | |
| 9,349,647 B2 | 5/2016 | Takenouchi | |
| 2003/0124771 A1 | 7/2003 | Maiz | |
| 2004/0209443 A1* | 10/2004 | Cadieux | B28D 5/0076 |
| | | | 438/460 |
| 2004/0212047 A1 | 10/2004 | Joshi et al. | |
| 2006/0223234 A1 | 10/2006 | Terayama et al. | |
| 2008/0191318 A1 | 8/2008 | Su et al. | |
| 2008/0277806 A1 | 11/2008 | Chen et al. | |
| 2011/0048200 A1 | 3/2011 | Ide et al. | |
| 2012/0286415 A1 | 11/2012 | Sakai et al. | |
| 2013/0203237 A1 | 8/2013 | Yamaguchi et al. | |
| 2013/0234193 A1 | 9/2013 | Odnoblyudov et al. | |
| 2014/0017882 A1 | 1/2014 | Lei et al. | |
| 2014/0154871 A1 | 6/2014 | Hwang et al. | |
| 2015/0262881 A1* | 9/2015 | Takenouchi | H01L 21/78 |
| | | | 438/460 |
| 2017/0213757 A1 | 7/2017 | Nakamura et al. | |
| 2018/0166328 A1 | 6/2018 | Tang et al. | |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/937,402, filed Mar. 27, 2018.
Takenouchi, Kenji, U.S. Appl. No. 15/938,832, filed Mar. 28, 2018.
Takenouchi, Kenji, U.S. Appl. No. 15/938,755, filed Mar. 28, 2018.
Takenouchi, Kenji, U.S. Appl. No. 15/940,468, filed Mar. 29, 2018.
Takenouchi, Kenji, U.S. Appl. No. 15/941,131, filed Mar. 30, 2018.
Takenouchi, Kenji, U.S. Appl. No. 15/942,682, filed Apr. 2, 2018.

* cited by examiner

PLATE-SHAPED WORKPIECE PROCESSING METHOD

BACKGROUND OF THE INVENTION

Field of the Invention

The present invention relates to a plate-shaped workpiece processing method for processing a plate-shaped workpiece having a division line and a metal member formed on the division line or in an area corresponding to the division line.

Description of the Related Art

A wafer such as a semiconductor wafer has a front side on which a plurality of devices are formed so as to be separated by a plurality of crossing division lines. The wafer thus having the devices is cut along the division lines and thereby divided into individual device chips. There is a case that a metal film is formed on the back side of the wafer, so as to improve the electrical characteristics of each device. However, when the metal film is cut by a cutting blade, the cutting blade may be clogged. Furthermore, when the wafer is cut by this cutting blade clogged, there arises a problem such that cracking may occur in the wafer or the cutting blade may be damaged.

In another case, a TEG (Test Element Group) as a metal member is formed on each division line of the wafer, so as to measure the electrical characteristics of each device. When this wafer having the TEG is cut along each division line by a cutting blade, the cutting blade may be clogged. As another plate-shaped workpiece having a division line and a metal member formed on the division line, a package substrate is known. The package substrate has an electrode surface on which a plurality of electrodes are formed. In a processing method for the package substrate, the package substrate is cut from the electrode surface by a cutting blade and thereby divided into individual packages. When the package substrate is cut from the electrode surface by the cutting blade, there is a problem such that burrs may be generated from the electrodes in cutting the package substrate. To prevent the clogging of the cutting blade, there has been proposed in Japanese Patent Laid-open No. 1997-55573 a method of cutting a workpiece having metal electrodes by using a carbide-tipped saw blade in place of the cutting blade.

SUMMARY OF THE INVENTION

In the cutting method disclosed in Japanese Patent Laid-open No. 1997-55573, however, the carbide-tipped saw blade has no self-sharpening function unlike the cutting blade, so that the sharpness of the saw blade is lowered at once. Accordingly, the frequency of exchange of the saw blade becomes high to cause a reduction in workability. On the other hand, when the metal member formed on the workpiece is cut by a cutting blade, the cutting blade may be clogged as described above and there also arises another problem such that the metal member cut by the cutting blade is elongated, causing the generation of burrs or the occurrence of dragging. In general, when a feed speed is increased, a cutting load is increased and a processing heat generated in cutting the workpiece is increased, resulting in an increase in degree of burrs or dragging. Accordingly, it is difficult to increase the feed speed from the viewpoint of prevention of a degradation in processing quality.

It is therefore an object of the present invention to provide a plate-shaped workpiece processing method for processing a plate-shaped workpiece having a division line and a metal member formed on the division line or in an area corresponding to the division line, in which the feed speed can be increased by this method as compared with the prior art.

In accordance with an aspect of the present invention, there is provided a plate-shaped workpiece processing method for processing a plate-shaped workpiece having a division line and a metal member formed on the division line or in an area corresponding to the division line, the plate-shaped workpiece processing method including a holding step of holding the plate-shaped workpiece on a chuck table in the condition where the metal member is exposed; a first cutting step of cutting the plate-shaped workpiece along the division line by using a first cutting blade after performing the holding step, thereby forming a first cut groove dividing the metal member; and a second cutting step of cutting the plate-shaped workpiece along the first cut groove by using a second cutting blade after performing the first cutting step, thereby forming a second cut groove fully cutting the plate-shaped workpiece; the first cutting step including the step of supplying a cutting fluid containing an organic acid and an oxidizing agent to the plate-shaped workpiece.

According to the processing method of the present invention, the plate-shaped workpiece is cut in two steps in its thickness direction by using the first and second cutting blades. Accordingly, the thickness of the workpiece to be cut in each step can be reduced, so that the processing speed (feed speed) in cutting the workpiece can be increased as compared with the case of fully cutting the workpiece in one step. Furthermore, in performing the first cutting step, the cutting fluid containing an organic acid and an oxidizing agent is supplied to the workpiece. Accordingly, the metal present on the workpiece is modified by the organic acid contained in the cutting fluid, so that the ductility of the metal is suppressed to thereby suppress the generation of burrs. Moreover, the film property on the surface of the metal member is changed by the oxidizing agent contained in the cutting fluid, so that the ductility of the metal member is lost to cause easy cutting, thereby improving the workability.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
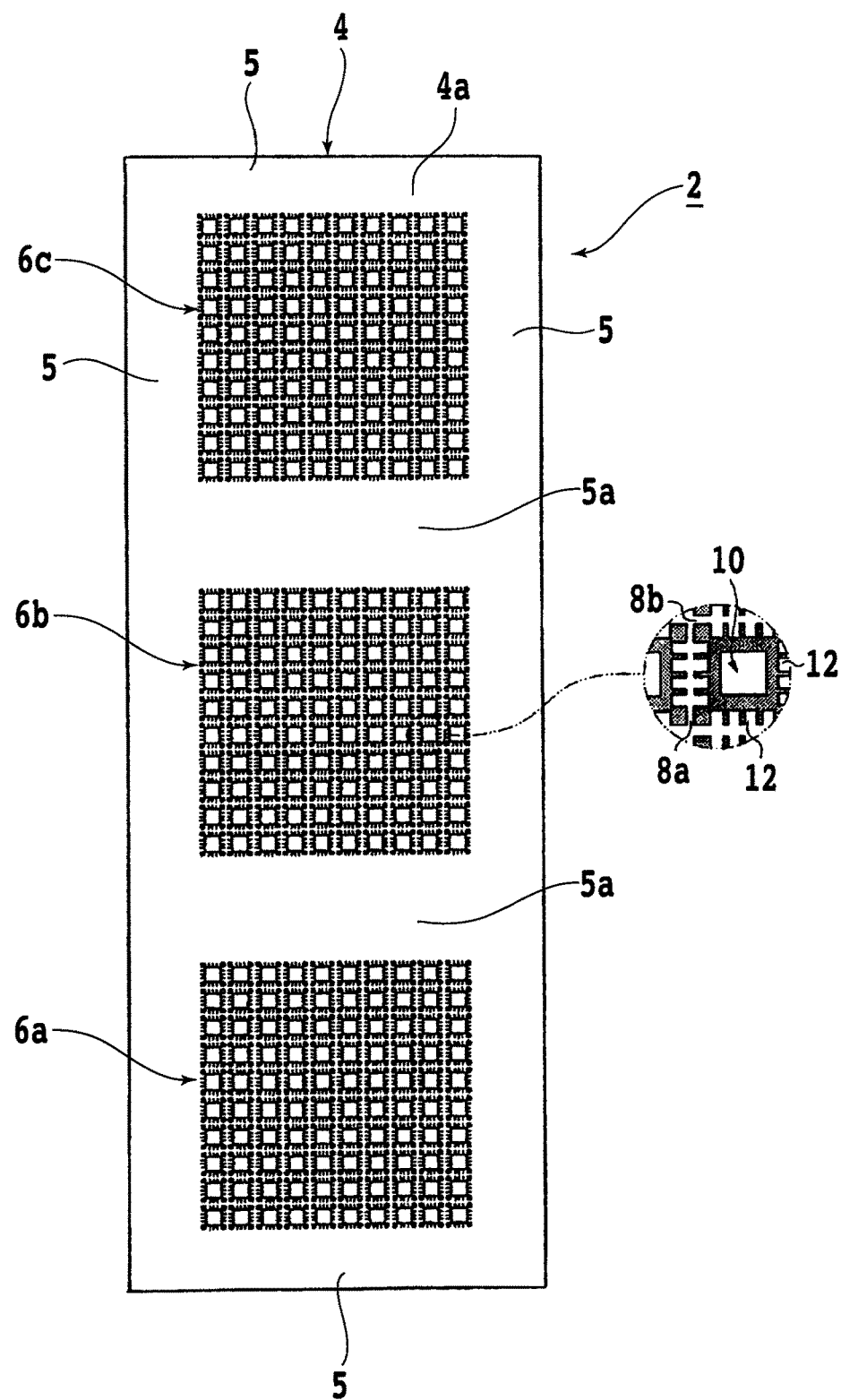
FIG. 1 is a top plan view of a package substrate.
Figure 2:
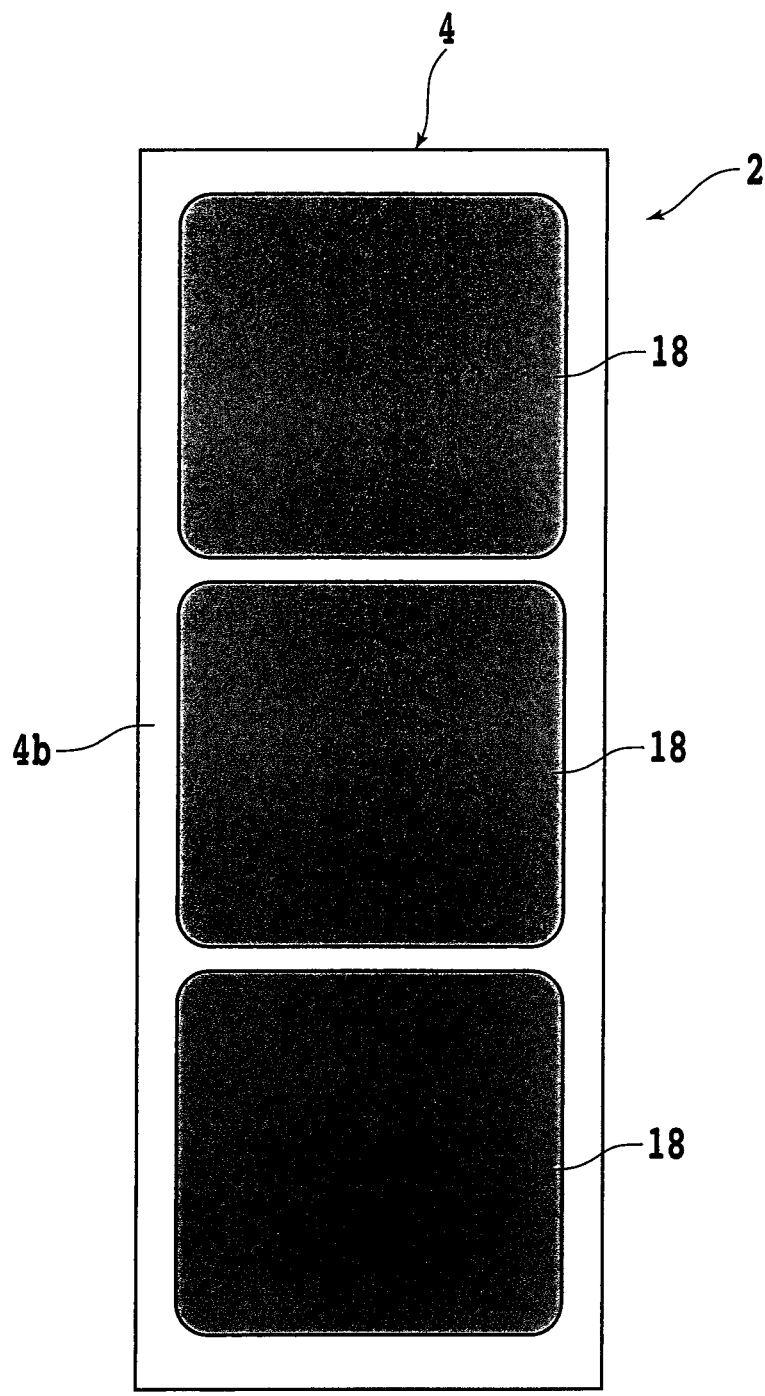
FIG. 2 is a bottom plan view of the package substrate shown in FIG. 1.

Preferred embodiments of the present invention will now be described in detail with reference to the drawings. Referring to FIG. 1, there is shown a top plan view of a package substrate 2 as a workpiece to be processed by the processing method of the present invention. FIG. 2 is a bottom plan view of the package substrate 2 shown in FIG. 1. As shown in FIGS. 1 and 2, the package substrate 2 has a rectangular base substrate 4. The base substrate 4 has an electrode surface 4a on the front side and a sealed surface 4b on the back side. A plurality of electrodes 12 are formed on the electrode surface 4a. The sealed surface 4b is opposite to the electrode surface 4a. The electrode surface 4a of the base substrate 4 has a peripheral marginal area 5 and two non-device areas 5a. Further, three device areas 6a, 6b, and 6c are defined so as to be surrounded by the peripheral marginal area 5 and the two non-device areas 5a. The base substrate 4 is formed from a metal frame, for example.

In each of the device areas 6a, 6b, and 6c, a plurality of device mounting portions 10 are defined so as to be separated by a plurality of first and second division lines 8a and 8b intersecting each other at right angles. Each device mounting portion 10 is formed with the plural electrodes 12. These electrodes 12 are insulated by a mold resin provided on the base substrate 4. Each of the first division lines 8a is cut along its center to separate the electrodes 12 formed on each division line 8a. Similarly, each of the second division lines 8b is cut along its center to separate the electrodes 12 formed on each division line 8b.

Although not shown, a device is mounted on each device mounting portion 10 of the base substrate 4. Each device has a plurality of electrodes, which are connected through gold wires to the electrodes 12 of each device mounting portion 10 of the base substrate 4. As shown in FIG. 2, three resin sealed portions 18 are formed on the back sides of the three device areas 6a, 6b, and 6c, i.e., on the sealed surface 4b of the base substrate 4. Each device is sealed with this resin.

Figure 3:
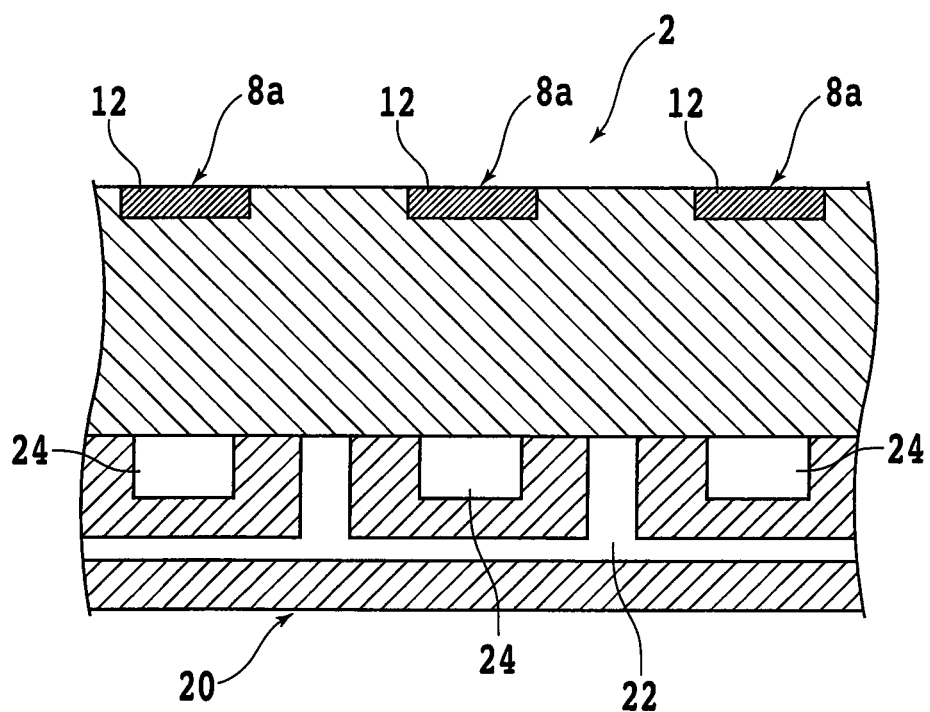
FIG. 3 is an enlarged sectional view showing a holding step.

There will now be described a plate-shaped workpiece processing method according to a preferred embodiment of the present invention with reference to FIGS. 3 to 7. In this preferred embodiment, the package substrate 2 is used as a plate-shaped workpiece. First, as shown in FIG. 3, a holding step is performed to hold the package substrate 2 through a jig table 20 on a chuck table of a cutting apparatus (not shown) under suction in the condition where the electrodes 12 formed on the division lines 8a and 8b of the package substrate 2 are exposed.

The jig table 20 includes a suction passage 22 and a plurality of escape grooves 24. The suction passage 22 is connected through the chuck table of the cutting apparatus to a vacuum source (not shown). The escape grooves 24 are formed so as to correspond to the respective division lines 8a and 8b of the package substrate 2. The escape grooves 24 function to prevent that the tip (outer edge) of a cutting blade may interfere with the jig table 20 in fully cutting the package substrate 2. The package substrate 2 is placed on the jig table 20 in the condition where the division lines 8a and 8b of the package substrate 2 are aligned with the escape grooves 24 of the jig table 20 as viewed in plan. Thereafter, the suction passage 22 of the jig table 20 is brought into communication with the vacuum source through the chuck table of the cutting apparatus, so that a vacuum is applied from the vacuum source to the suction passage 22, thereby holding the package substrate 2 through the jig table 20 on the chuck table under suction.

Figure 4:
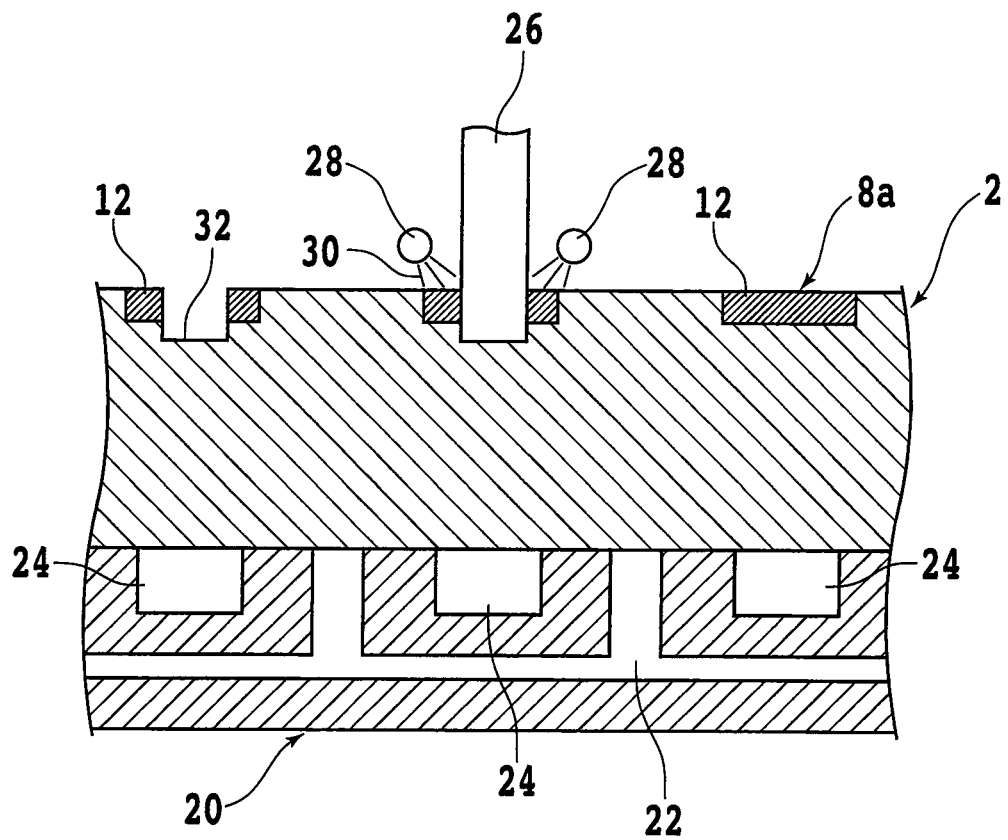
FIG. 4 is an enlarged sectional view showing a first cutting step.

After performing the holding step, a first cutting step is performed to cut the package substrate 2 along the division lines 8a and 8b by using a cutting blade 26 as a first cutting blade, thereby forming a first cut groove 32 dividing each electrode 12 formed on the division lines 8a and 8b as shown in FIG. 4. In this first cutting step, a cutting fluid 30 containing an organic acid and an oxidizing agent is supplied from a pair of cutting fluid nozzles 28 provided on both sides of the cutting blade 26 as shown in FIG. 4. That is, the package substrate 2 is shallowly cut by the cutting blade 26 to form the first cut groove 32 dividing each electrode 12 as supplying the cutting fluid 30 to the package substrate 2.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N—N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 30. Mixing of the anticorrosive makes it possible to prevent corrosion (elution) of the metal included in the package substrate 2. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

As described above, the cutting fluid 30 containing an organic acid and an oxidizing agent is supplied from the cutting fluid nozzles 28 in the first cutting step. Accordingly, the metal forming the electrodes 12 is modified by the organic acid contained in the cutting fluid 30, so that the ductility of the metal can be suppressed to thereby suppress the generation of burrs. Furthermore, the film property on the surface of each electrode 12 is changed by the oxidizing agent contained in the cutting fluid 30, so that the ductility of each electrode 12 is lost to thereby exhibit the effect that each electrode 12 can be easily cut to improve the workability.

Figure 6A:
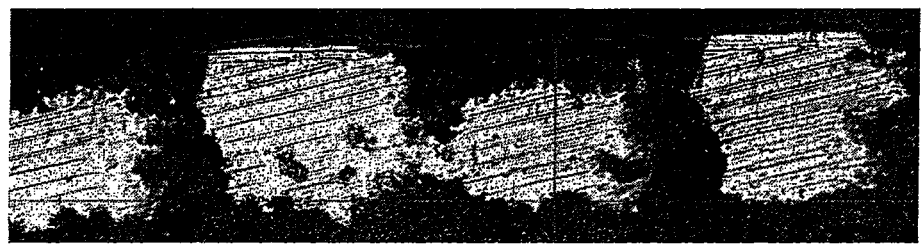
FIG. 6A is a cross section of electrodes included in the package substrate after performing the first cutting step as supplying a pure water as a comparison.
Figure 6B:
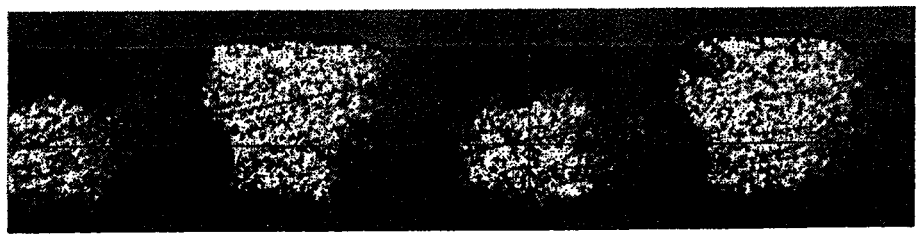
FIG. 6B is a view similar to FIG. 6A, showing the case of supplying a cutting fluid containing an organic acid and an oxidizing agent according to the present invention.
Figure 7:
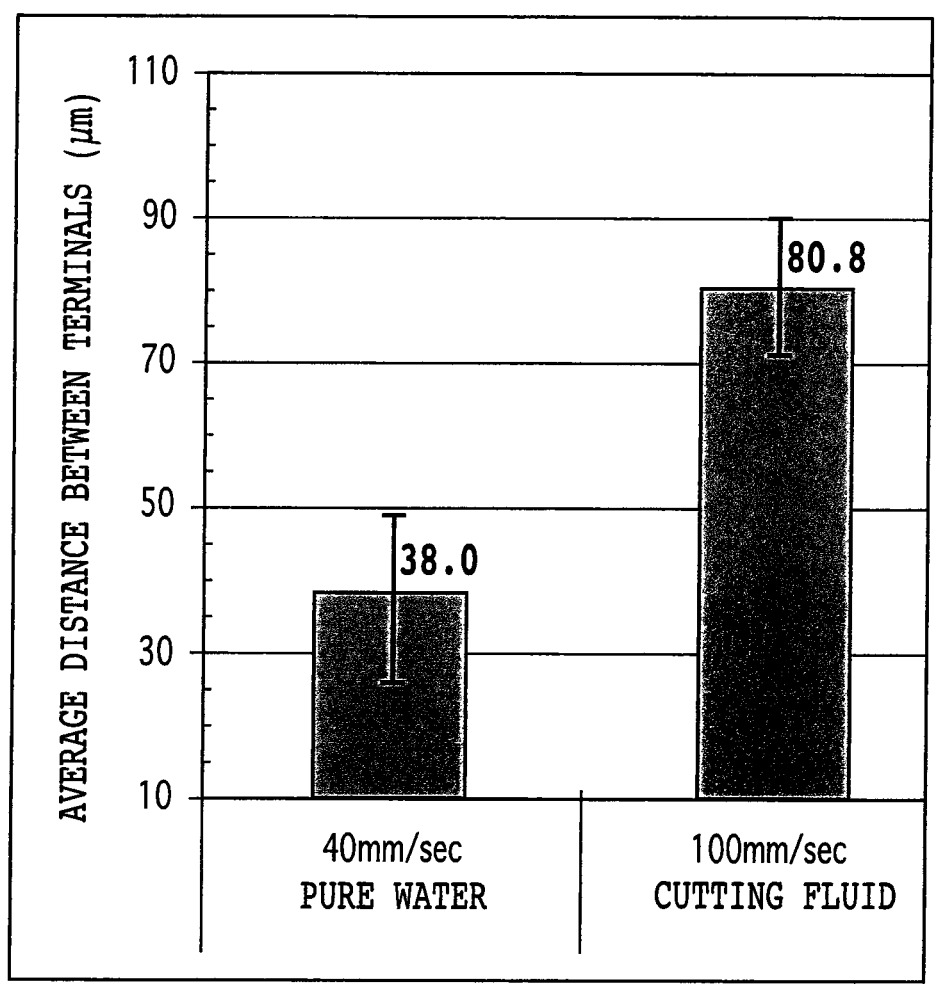
FIG. 7 is a graph showing an average distance between terminals after performing the first cutting step in the case of supplying a pure water and in the case of supplying the cutting fluid.

A test was conducted to examine the degree of elongation of each electrode 12 of the package substrate 2 in the case of performing the first cutting step as supplying the cutting fluid 30 as compared with the case of performing the first cutting step as supplying a pure water, with reference to FIGS. 6A, 6B, and 7. In this test, the distance between the adjacent electrodes 12 of the package substrate 2 was set to 100 µm. Further, the feed speed in performing the first cutting step as supplying a pure water was set to 40 mm/second, and the feed speed in performing the first cutting step as supplying the cutting fluid 30 containing an organic acid and an oxidizing agent was set to 100 mm/second.

FIG. 6A is a sectional view of the package substrate 2 cut along the division lines 8a and 8b in the case of performing the first cutting step as supplying a pure water, and FIG. 6B is a sectional view of the package substrate 2 cut along the division lines 8a and 8b in the case of performing the first cutting step as supplying the cutting fluid 30 containing an organic acid and an oxidizing agent.

As apparent from FIG. 6A, the degree of elongation of each electrode 12 is large and the adjacent electrodes 12 are short-circuited at a certain position in the case of performing the first cutting step as supplying a pure water. In contrast, it is observed from FIG. 6B that the degree of elongation of each electrode 12 is apparently small in the case of performing the first cutting step as supplying the cutting fluid 30. This result is considered to be due to the fact that the metal of each electrode 12 is modified by the organic acid contained in the cutting fluid 30 to cause the suppression of ductility, so that the generation of burrs is suppressed.

FIG. 7 is a graph showing an average distance between terminals after cutting the package substrate 2 along the division lines 8a in the case of supplying a pure water and in the case of supplying the cutting fluid 30 containing an organic acid and an oxidizing agent. Initially, the distance between the adjacent electrodes 12 (terminals) of the package substrate 2 was set to 100 µm. Further, the feed speed in the case of supplying a pure water in the first cutting step was set to 40 mm/second, and the feed speed in the case of supplying the cutting fluid 30 containing an organic acid and an oxidizing agent in the first cutting step was set to 100 mm/second.

As apparent from FIG. 7, the average distance between terminals after cutting is 38.0 µm in the case of supplying a pure water in the first cutting step. In contrast, the average distance between terminals after cutting is 80.8 µm in the case of supplying the cutting fluid 30 in the first cutting step. The result that the average distance between terminals after cutting is short means that each electrode 12 was largely elongated by cutting, whereas the result that the average distance between terminals after cutting is long means that the degree of elongation of each electrode 12 by cutting is small.

Further, in the case of supplying the cutting fluid 30 in the first cutting step, the film property on the surface of each electrode 12 is changed by the oxidizing agent contained in the cutting fluid 30, so that the ductility of the metal forming each electrode 12 is lost to thereby effect easy cutting of each electrode 12. Accordingly, the feed speed can be increased to 100 mm/second in this case. That is, it is apparent that the feed speed is improved in the case of supplying the cutting fluid 30 in the first cutting step as compared with the feed speed of 40 mm/second in the case of supplying a pure water in the first cutting step.

Figure 5A:
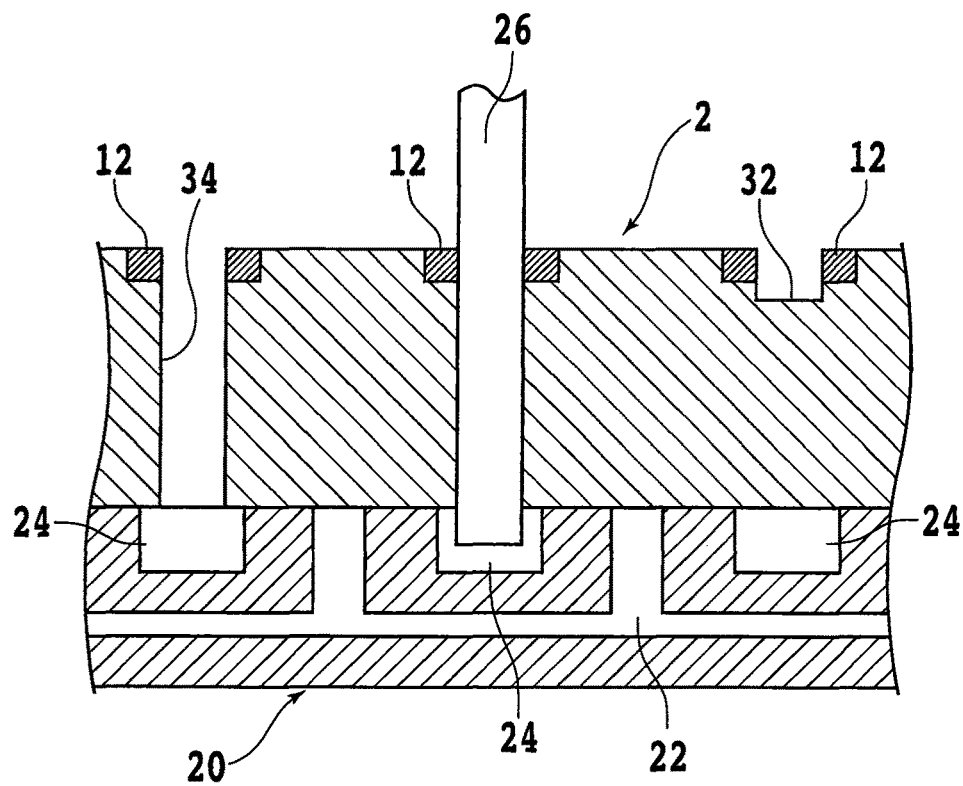
FIG. 5A is an enlarged sectional view showing a second cutting step in the case of using the same cutting blade as that used in the first cutting step.

After performing the first cutting step, a second cutting step is performed to cut the package substrate 2 along each first cut groove 32 by using a second cutting blade, thereby forming a second cut groove fully cutting the package substrate 2. FIG. 5A shows a first preferred embodiment of this second cutting step. In the first preferred embodiment shown in FIG. 5A, the same cutting blade 26 as that used in the first cutting step is used as the second cutting blade to thereby form a second cut groove 34 fully cutting the package substrate 2 along each first cut groove 32 previously formed. That is, the package substrate 2 is cut along each first cut groove 32 by the cutting blade 26 in such a manner that the lower edge of the cutting blade 26 comes into the escape groove 24 of the jig table 20 corresponding to each first cut groove 32, so that the second cut groove 34 is formed so as to fully cut the package substrate 2.

Figure 5B:
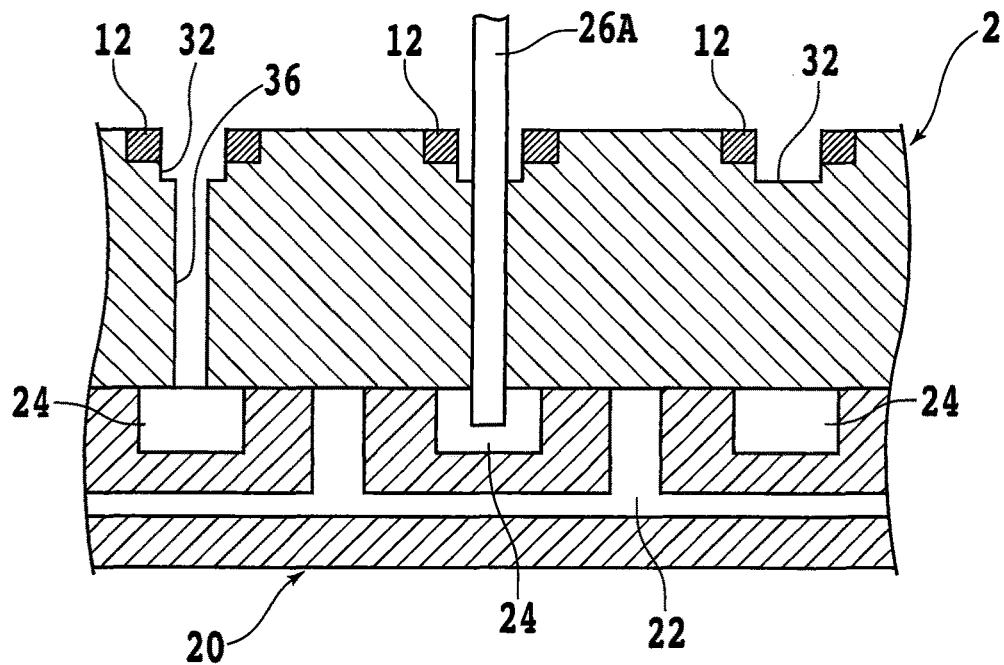
FIG. 5B is a view similar to FIG. 5A, showing the case of using a cutting blade having a thickness smaller than that of the cutting blade used in the first cutting step.

FIG. 5B shows a second preferred embodiment of the second cutting step. In the second preferred embodiment shown in FIG. 5B, a cutting blade 26A having a thickness smaller than that of the cutting blade 26 used in the first cutting step is used as the second cutting blade to thereby form a second cut groove 36 fully cutting the package substrate 2 along each first cut groove 32 previously formed. Accordingly, the second cut groove 36 shown in FIG. 5B has a width smaller than that of the second cut groove 34 shown in FIG. 5A. As shown in FIG. 5B, the package substrate 2 is cut along the center of each first cut groove 32 by the cutting blade 26A in such a manner that the lower edge of the cutting blade 26A comes into the escape groove 24 of the jig table 20 corresponding to each first cut groove 32, so that the second cut groove 36 is formed so as to fully cut the package substrate 2.

In each of the first and second preferred embodiments shown in FIGS. 5A and 5B, the package substrate 2 is fully cut along all of the first division lines 8a extending in a first direction by indexing the cutting blade 26 or 26A. Thereafter, the chuck table holding the jig table 20 thereon is rotated 90 degrees to similarly fully cut the package substrate 2 along all of the second division lines 8b extending in a second direction perpendicular to the first direction. As a result, the package substrate 2 can be divided into individual CSPs (Chip Size Packages).

While the processing method of the present invention is applied to the package substrate 2 in the above preferred embodiments, the applicability of the present invention is not limited to such a workpiece. For example, the processing method of the present invention is also applicable to a wafer having a conductor film (multilayer metal film of Ti, Ni, or Au, for example) having a thickness of several micrometers as a back-side electrode or a wafer having a TEG on each division line formed on the front side.

Figure 8:
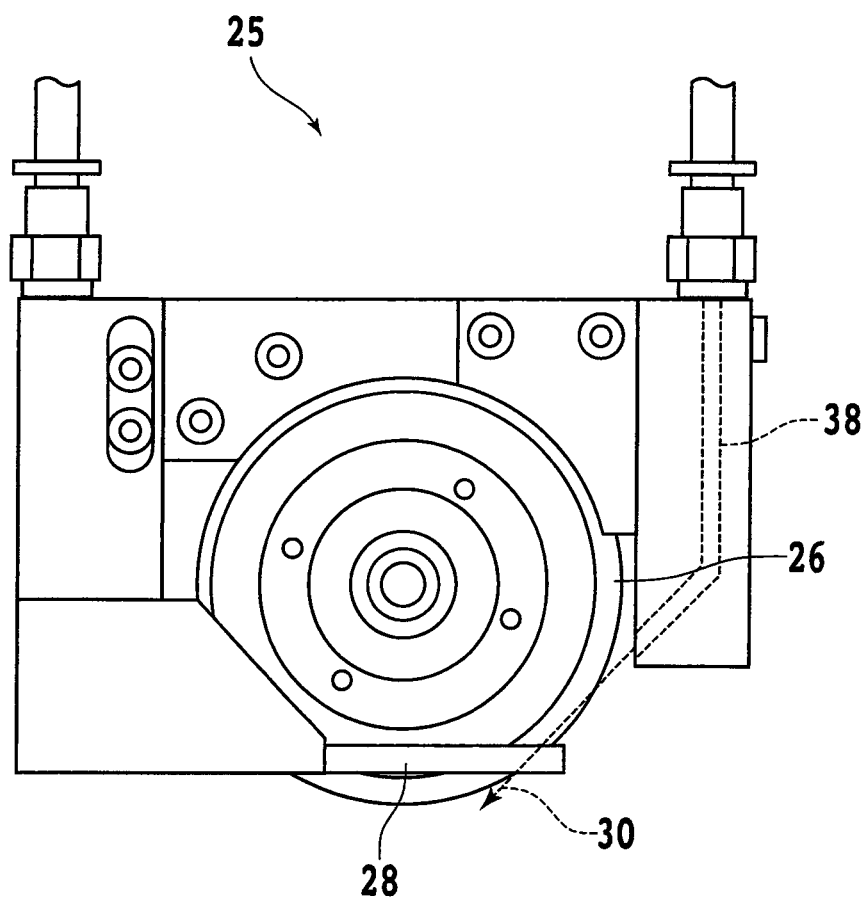
FIG. 8 is a side view showing nozzle means for supplying the cutting fluid in the first cutting step according to a modification.

Further, while the cutting fluid 30 is supplied from the pair of nozzles 28 located on both sides of the cutting blade 26 in the first cutting step, any nozzle means capable of supplying the cutting fluid 30 may be adopted in the present invention. FIG. 8 is a side view of a cutting unit 25 including such nozzle means capable of supplying the cutting fluid 30 according to a modification. As shown in FIG. 8, the cutting unit 25 includes a nozzle (shower nozzle) 38 for supplying the cutting fluid 30, in addition to the cutting blade 26 and the pair of nozzles 28. The nozzle 38 is located on the front side of the cutting blade 26 in its cutting direction (feeding direction).

By supplying the cutting fluid 30 from the nozzle 38, the cutting fluid 30 can be easily supplied to the electrodes 12, so that the metal forming each electrode 12 can be modified by the cutting fluid 30 to thereby suppress the ductility of the metal. Accordingly, the generation of burrs can be suppressed. In particular, the nozzle opening of the nozzle 38 is preferably directed obliquely downward (e.g., toward the work position where the cutting blade 26 cuts the workpiece) as shown in FIG. 8. With this configuration, the cutting fluid 30 can be supplied more easily to the electrodes 12, so that the metal forming each electrode 12 can be effectively modified by the cutting fluid 30. While the pair of nozzles 28 and the nozzle 38 are used to supply the cutting fluid 30 in the modification shown in FIG. 8, only the nozzle 38 may be used to supply the cutting fluid 30.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A plate-shaped workpiece processing method for processing a plate-shaped workpiece having a division line and a metal member formed on said division line or in an area corresponding to said division line, said plate-shaped workpiece processing method comprising:
   a holding step of holding said plate-shaped workpiece on a chuck table in the condition where said metal member is exposed;
   a first cutting step of cutting said plate-shaped workpiece along said division line by using a first cutting blade after performing said holding step, thereby forming a first cut groove dividing said metal member; and
   a second cutting step of cutting said plate-shaped workpiece along said first cut groove by using a second cutting blade after performing said first cutting step, thereby forming a second cut groove fully cutting said plate-shaped workpiece, wherein said second cutting blade contacts said metal member during said second cutting step;
   said first cutting step including the step of supplying a cutting fluid containing an organic acid and an oxidizing agent to said plate-shaped workpiece.

2. The plate-shaped workpiece processing method according to claim 1, wherein said organic acid comprises an amino acid.

3. The plate-shaped workpiece processing method according to claim 2, wherein said amino acid is an acid selected from the group consisting of glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, and antipain.

4. The plate-shaped workpiece processing method according to claim 1, wherein said organic acid comprises an amino polyacid.

5. The plate-shaped workpiece processing method according to claim 4, wherein said amino polyacid is an acid selected from the group consisting of iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, and N—N'-bis(2-hydroxybenzyl)ethylenediamine-N,N'-diacetic acid.

6. The plate-shaped workpiece processing method according to claim 1, wherein said oxidizing agent is selected from the group consisting of hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

7. The plate-shaped workpiece processing method according to claim 1, wherein said oxidizing agent is selected from the group consisting of hydrogen peroxide, peroxides, nitrates, iodates, periodates, hypochlorites, chlorites, chlorates, perchlorates, persulfates, dichromates, permanganates, cerates, vanadates, silver(II) salts, iron(III) salts, and their organic complex salts.

8. The plate-shaped workpiece processing method according to claim 1, wherein said first cutting step is performed at a feed speed of 100 mm/second.

9. A plate-shaped workpiece processing method for processing a plate-shaped workpiece having a division line and a metal member formed on said division line or in an area corresponding to said division line, said plate-shaped workpiece processing method comprising:
   a holding step of holding said plate-shaped workpiece on a chuck table in the condition where said metal member is exposed;
   a first cutting step of cutting said plate-shaped workpiece along said division line by using a first cutting blade after performing said holding step, thereby forming a first cut groove dividing said metal member;
   said first cutting step including the step of supplying a cutting fluid containing an organic acid and an oxidizing agent to said plate-shaped workpiece, and
   a second cutting step of cutting said plate-shaped workpiece along said first cut groove by using a second cutting blade after performing said first cutting step, thereby forming a second cut groove fully cutting said plate-shaped workpiece, wherein said second cutting blade contacts said metal member during said second cutting step, and
   wherein said second cutting blade is the same as said first cutting blade.

10. The plate-shaped workpiece processing method according to claim 9, wherein said first cutting step is performed at a feed speed of 100 mm/second.

11. A plate-shaped workpiece processing method for processing a plate-shaped workpiece having a division line and a metal member formed on said division line or in an area corresponding to said division line, said plate-shaped workpiece processing method comprising:
   a holding step of holding said plate-shaped workpiece on a chuck table in the condition where said metal member is exposed;
   a first cutting step of cutting said plate-shaped workpiece along said division line by using a first cutting blade after performing said holding step, thereby forming a first cut groove dividing said metal member, wherein said first cut groove extends through said metal member at a constant width; and
   a second cutting step of cutting said plate-shaped workpiece along said first cut groove by using a second cutting blade after performing said first cutting step, thereby forming a second cut groove fully cutting said plate-shaped workpiece;
   said first cutting step including the step of supplying a cutting fluid containing an organic acid and an oxidizing agent to said plate-shaped workpiece,
   wherein said oxidizing agent changes the film property of the metal member and said organic acid modifies the metal member to suppress its ductility, and
   wherein said second cutting blade has a thickness smaller than a thickness of said first cutting blade.

12. The plate-shaped workpiece processing method according to claim 11, wherein said organic acid comprises an amino acid.

13. The plate-shaped workpiece processing method according to claim 12, wherein said amino acid is an acid selected from the group consisting of glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

14. The plate-shaped workpiece processing method according to claim 11, wherein said organic acid comprises an amino polyacid.

15. The plate-shaped workpiece processing method according to claim 14, wherein said amino polyacid is an acid selected from the group consisting of iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, and N—N'-bis(2-hydroxybenzyl)ethylenediamine-N,N'-diacetic acid.

16. The plate-shaped workpiece processing method according to claim 11, wherein said oxidizing agent is selected from the group consisting of hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

17. The plate-shaped workpiece processing method according to claim 11, wherein said oxidizing agent is selected from the group consisting of hydrogen peroxide, peroxides, nitrates, iodates, periodates, hypochlorites, chlorites, chlorates, perchlorates, persulfates, dichromates, permanganates, cerates, vanadates, silver(II) salts, iron(III) salts, and their organic complex salts.

18. The plate-shaped workpiece processing method according to claim 11, wherein said first cutting step is performed at a feed speed of 100 mm/second.

* * * * *